(12) United States Patent
Yang et al.

(10) Patent No.: US 8,753,559 B2
(45) Date of Patent: Jun. 17, 2014

(54) FABRICATION METHOD OF NANOPARTICLE

(75) Inventors: Chih-Chung Yang, Taipei (TW); Hung-Yu Tseng, Taipei (TW); Wei-Fang Chen, Taipei (TW); Che-Hao Liao, Taipei (TW); Yu-Feng Yao, Taipei (TW)

(73) Assignee: National Taiwan University, Taipei (TW)

( * ) Notice: Subject to any disclaimer, the term of this patent is extended or adjusted under 35 U.S.C. 154(b) by 209 days.

(21) Appl. No.: 13/530,104

(22) Filed: Jun. 21, 2012

(65) Prior Publication Data

US 2013/0285267 A1    Oct. 31, 2013

(30) Foreign Application Priority Data

Apr. 27, 2012  (TW) .............................. 101115226 A

(51) Int. Cl.
  *B22D 29/00*    (2006.01)
  *B29C 33/42*    (2006.01)

(52) U.S. Cl.
  USPC ............ 264/317; 264/219; 75/10.1; 164/131; 977/773; 977/810; 977/828; 977/887

(58) Field of Classification Search
  None
  See application file for complete search history.

(56) References Cited

U.S. PATENT DOCUMENTS

| 7,983,074 B2 * | 7/2011 | Zhu et al. ....................... 365/158 |
| 2010/0086801 A1 * | 4/2010 | Russell et al. ................ 428/551 |
| 2010/0323173 A1 * | 12/2010 | Van Roy et al. .............. 428/208 |

OTHER PUBLICATIONS

Aizpurua et al., "Optical Properties of Gold Nanorings," Physical Review Letters 90 (5), Feb. 7, 2003, pp. 057401-1-057401-4.
Larsson et al., "Sensing Characteristics of NIR Localized Surface Plasmon Resonances in Gold Nanorings for Application as Ultrasensitive Biosensors," Nano Letters 7 (5), Apr. 13, 2007, pp. 1256-1263.
Hao et al., "Shedding light on dark plasmons in gold nanorings," Chemical Physics Letters 458, Jun. 17, 2008, pp. 262-266.
Tseng et al, "Au nanorings for enhancing absorption and backscattering monitored with optical coherence tomography," Nanotechnology 21, Jul. 5, 2010, pp. 295102-1-295102-9.
Lee et al., "Characterizing the localized surface plasmon resonance behaviors of Au nanorings and tracking their diffusion in bio-tissue with optical coherence tomography," Biomedical Optics Express 1 (4), Nov. 1, 2010, pp. 1060-1074.

* cited by examiner

*Primary Examiner* — Mary F Theisen
(74) *Attorney, Agent, or Firm* — Jianq Chyun IP Office

(57) ABSTRACT

A fabrication method of nanoparticles is provided. A substrate having a plurality of pillar structures is provided and then a plurality of ring structures is formed to surround the plurality of the pillar structures. The inner wall of each ring structure surrounds the sidewall of each pillar structure. A portion of each pillar structure is removed to reduce the height of each pillar structure and to expose the inner wall of each ring structure. The ring structures are separated from the pillar structures to form a plurality of nanoparticles. Surface modifications are applied to the ring structures before the ring structures are separated from the pillar structures on the substrate.

15 Claims, 5 Drawing Sheets

FABRICATION METHOD OF NANOPARTICLE

CROSS-REFERENCE TO RELATED APPLICATION

This application claims the priority benefit of Taiwan application serial no. 101115226, filed on Apr. 27, 2012. The entirety of the above-mentioned patent application is hereby incorporated by reference herein and made a part of this specification.

BACKGROUND OF THE INVENTION

1. Field of the Invention

The present invention generally relates to a fabrication method of nanoparticles. More particularly, the present invention relates to a fabrication method of nanorings.

2. Description of Related Art

As the advancements toward high precision and minuteness become the main trend in various types of industries, the tiny nanoparticles are nowadays considered as materials of tremendous potentials. Following the developments of the nanoparticle related technologies, the possible applicable ranges or uses of the nanoparticles have been rapidly extended in different industries. Sorting by the material of the nanoparticle, the nanoparticles may be made of metal or a dielectric material. The metal nanoparticles, possessing the capability of inducing localized surface plasmon resonance (LSPR), draw great attentions to their promising applications in biomedical fields.

In general, the metal nanoparticles include nanospheres, nanorods, nanorings, nanoshells and nanocages. Due to their unique geometries, the nanorings have the LSPR at longer wavelengths and the nanorings may have more extensive biomedical applications. Especially, the gold nanorings can have the LSPR wavelengths up to 1300 nanometers, at which light can achieve the deepest penetration into biological tissues, and hence have wide biomedical applications.

Conventionally, metal nanorings can be fabricated with the technique of plastic nanosphere lithography. However, it is nearly impossible to precisely control the size of each plastic nanosphere with the existing technology. Under the circumstances that the size of the available plastic nanosphere is not uniform, the size of the consequently formed metal nanoring is not uniform, that further has an impact on the LSPR wavelength ranges of the nanorings (for example, the wavelength distribution ranges of their LSPR are too large and their LSPR strengths are too weak).

SUMMARY OF THE INVENTION

The present invention relates to a fabrication method of nanoparticles and the nanoparticles made thereby. The provided nanoparticles are uniform in size.

The present invention is directed to a fabrication method of nanoparticles. A substrate having a plurality of pillar structures is provided and then a plurality of ring structures is formed to surround the plurality of the pillar structures. The inner wall of each ring structure surrounds the sidewall of each pillar structure. A portion of each pillar structure is removed to reduce the height of each pillar structure and to expose the inner wall of each ring structure. The ring structures are separated from the pillar structures to form a plurality of nanoparticles.

According to embodiments of the present invention, a step of fine-tuning a height, a diameter or a combination thereof of each pillar structure may be performed before forming the plurality of the ring structures. Alternatively, a step of performing a surface modification process to the plurality of the ring structures may be performed before separating the plurality of the ring structures from the remained pillar structures. The surface modification process may be a bio-conjugation process.

The present invention can control the sizes of the obtained nanoparticles and provide nanoparticles of a uniform size by fine-tuning the sizes of the pillar structures. Also, the yield of the surface-modified nanoparticles is high as the nanoparticles are fixed on the substrate when the nanoparticles are surface modified or surface treated.

In order to make the above and other features and advantages of the present invention more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

Common reference numerals are used throughout the drawings and the detailed description to indicate the same elements. The present invention will be more apparent from the following detailed description taken in conjunction with the accompanying drawings.

DESCRIPTION OF THE EMBODIMENTS

Figure 1A:
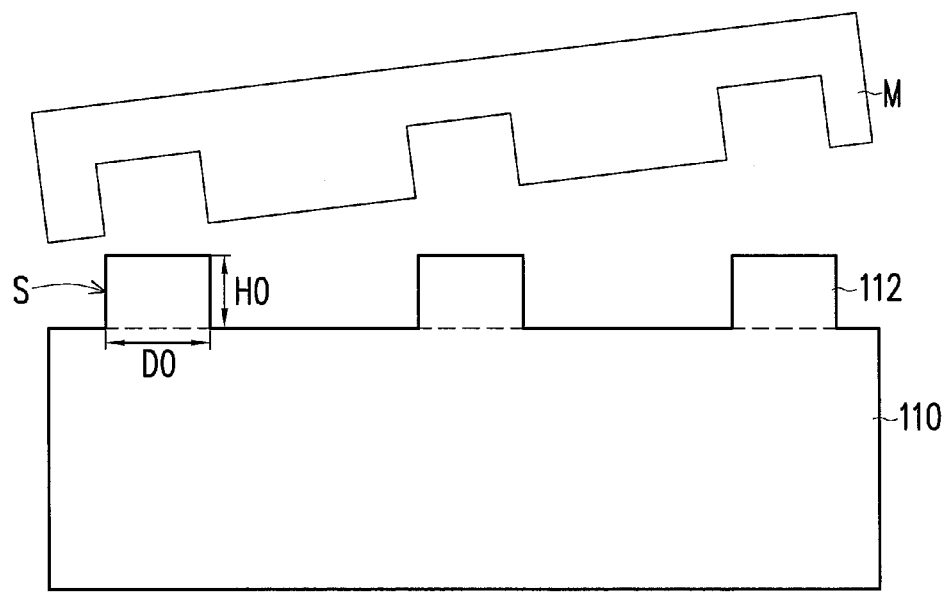
FIGS. 1A-1E are schematic cross-sectional views showing the steps of the fabrication method for nanoparticles according to one embodiment of the present invention.

FIGS. 1A-1E are schematic cross-sectional views showing the steps of the fabrication method for nanoparticles according to one embodiment of the present invention. Referring to FIG. 1A, a substrate 110 is provided and has a plurality of pillar structures 112 disposed on the top surface of the substrate 110. The material of the substrate 110 may be plastic, glass, silicon or any suitable material, for example. In this embodiment, the material of the substrate 110 may be plastic, and the pillar structures 112 are formed by pressing the nano imprint mold M having the relief pattern onto the substrate 110 to transfer the pattern to the substrate 110. In other embodiment, when the material of the substrate 110 is silicon, the pillar structures 112 may be formed by etching, laser processing or other suitable processes. The pillar structure 112 may be a cylinder structure, for example, and each pillar structure has a sidewall S, a height H0 and a diameter D0. In principle, the pillar structures 112 are of nano-scales and may be regarded as nanopillars.

Figure 1B:
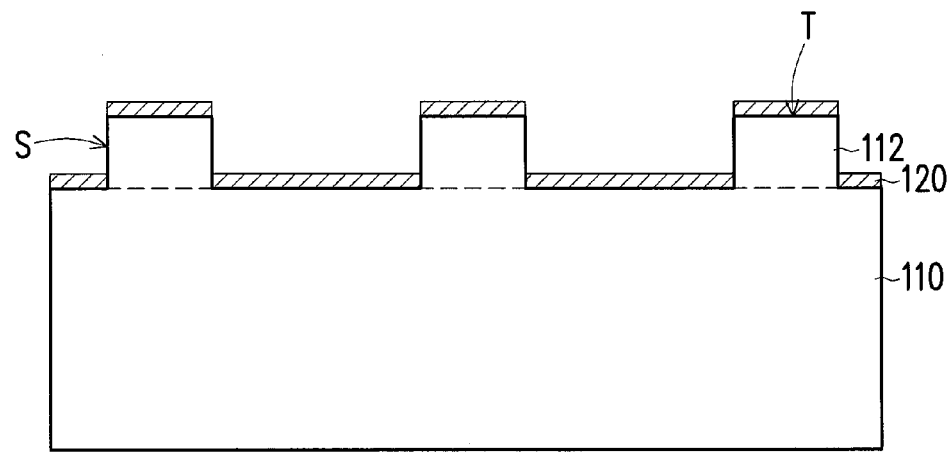

Referring to FIG. 1B, a metal material layer 120 is formed over the substrate 110 covering the substrate surface between the pillar structures 112 and formed on the top surface T of each pillar structure 112. The metal material layer 120 may be made of gold, silver, copper, aluminum or nickel, preferably gold, for example. For example, the metal material layer 120 is a thin gold film deposited by electron-beam evaporation.

Figure 1C:
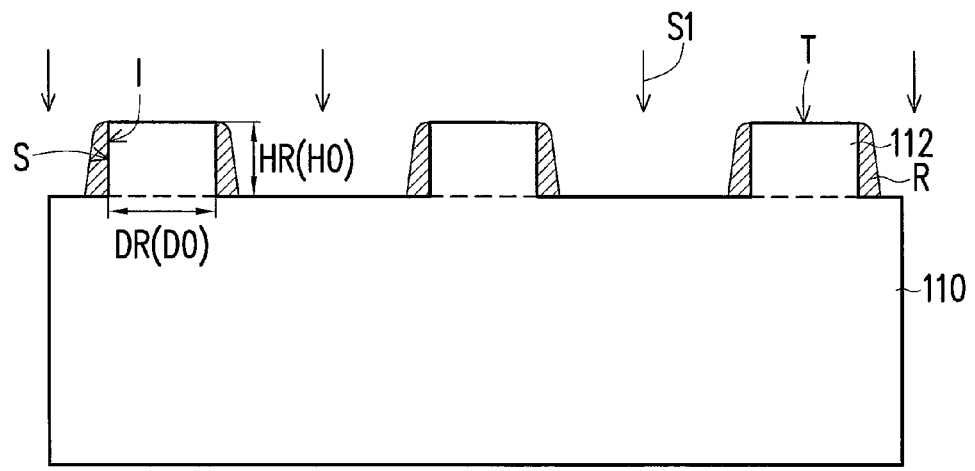

Referring to FIG. 1C, a plurality of ring structures R is formed to surround the sidewall S by performing an ion bombardment process S1. During the ion bombardment process S1, the metal material layer 120 on the top surfaces T of the pillar structures 112 is removed, while the metal material of the layer 120 located on the substrate surface between the adjacent pillar structures 112 is sputtered and adhered to the sidewall S of the pillar structures 112, so as to form the ring structures R surrounding the pillar structures 112. Preferably, the material of the ring structure R is gold, for example. Under the circumstances with sufficient metal material available and adequate performing time of the ion bombardment process S1, the ring structure R has an inner diameter DR that is substantially equal to the diameter D0 of the pillar structure 112, as the ring structure R is formed directly on the sidewall of the pillar structure 112. Also, a height HR of the ring structure R is substantially equal to the height H0 of the pillar structure 112.

In fact, the thickness of the ring structure R may be influenced or controlled by the thickness of the deposited metal material layer over the substrate. The thinner metal material layer is applied with less metal material, a thinner ring structure is obtained. In practice, the thickness, the inner diameter DR and the height HR of the ring structure R may be varied depending on the process parameters and process variation. For example, the performing time of the ion bombardment process Si may influence the thickness or the height HR of the ring structure R.

The ion bombardment process Si may be the reactive ion etching process or the ion milling process. In this embodiment, the ion bombardment process S1 may be the reactive ion etching process using trifluromethane plasma, for example. In other embodiments, the gas used in the reactive ion etching process may be argon, oxygen, tetrafluorocarbon or sulfur hexafluoride, for example.

Figure 1D:
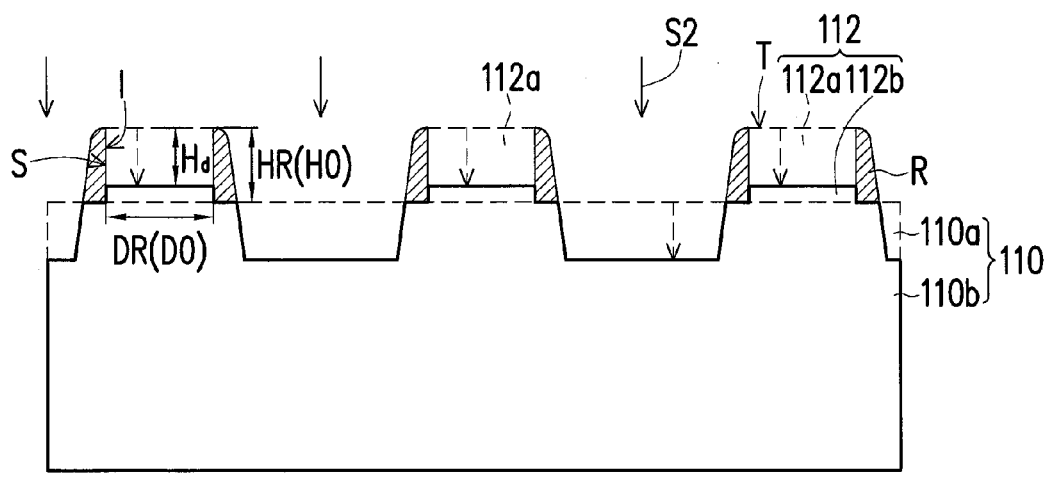

Referring to FIG. 1D, a first portion 112a of each pillar structure 112 is removed to lower the height H0 (height reduction by Hd) of the pillar structure 112 and expose the inner sidewall I of each ring structure that corresponds to the first portion 112a. The first portion 112a may be removed by using a reactive ion etching process or irradiating ozone with UV light to generate free radicals for etching. In this embodiment, the first portion 112a of each pillar structure 112 is removed by performing oxygen ($O_2$) plasma reactive ion etching process S2, for example. In other embodiments, the gas used in the reactive ion etching process may be tetrafluorocarbon or sulfur hexafluoride, for example.

During the oxygen ($O_2$) plasma reactive ion etching process S2, not only the first portion 112a of each pillar structure 112 is removed to lower the height H0 of the pillar structure 112 (height reduction by Hd), portions 110a of the substrate 110 between the ring structures R are also removed so as to form concavity in the remained substrate 110b. The surface profile of the remained substrate 110b is different from that of the original substrate 110. In this embodiment, the height reduction range Hd is smaller than the height H0 of the pillar structure 112, and a bottom portion of the ring structure R is held onto the remained portion 112b of each pillar structure 112. However, in other embodiments, the height reduction range Hd may be equal to or larger than the height H0 of the pillar structure 112. In that case, the ring structures R rest on the remained substrate 110b.

Figure 1E:
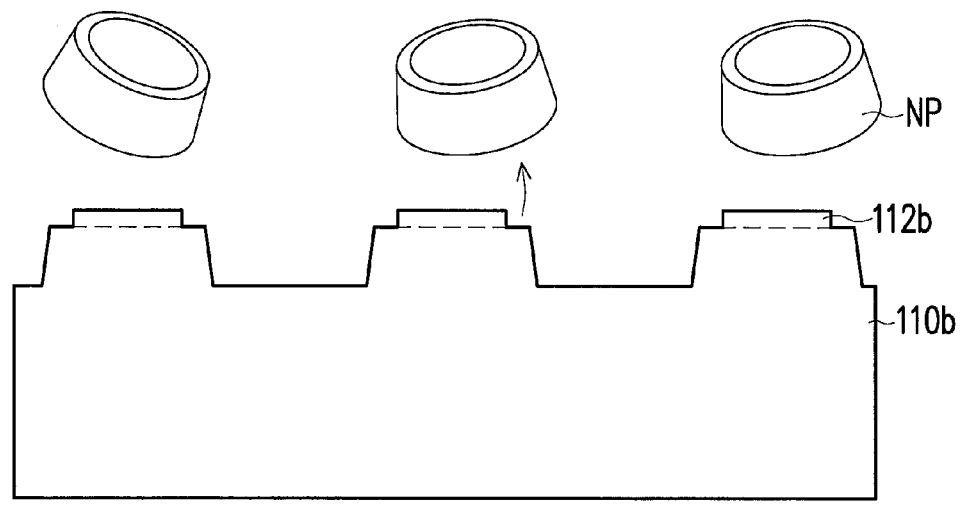

Referring to FIG. 1E, the ring structures R are completely separated from the remained portions 112b of the pillar structures 112 and/or the remained substrate 110b by performing a sonication process, for example and a plurality of nanorings (nanoring particles) NP is obtained. The lift-off ring structures R are the obtained nanorings NP.

The geometry of the nanorings (including the inner diameter, thickness and height of the nanorings) will influence the LSPR wavelengths of the nanorings. In this embodiment, by adjusting the diameter D0 and height H0 of the pillar structure 112, the inner diameter of the nanoring (i.e. the inner diameter DR) and the height of the nanoring (i.e. the height HR of the ring structure R) are changed and thus the LSPR wavelength of the nanorings may be altered. It is to mention that the above mentioned thickness of the ring structure R will also influence the LSPR wavelengths of the nanorings. And the thickness of the ring structure R may be influenced or controlled by the thickness of the deposited metal material layer 120 over the substrate 110 in FIG. 1B and the performing time of the ion bombardment process S1 in FIG. 1C.

Although the above embodiment describes the fabrication of nanorings, similar process steps or procedures may be applicable for the fabrication of other types of nanoparticles and the scope of this invention is not limited by the embodiments provided therein.

Figure 2:
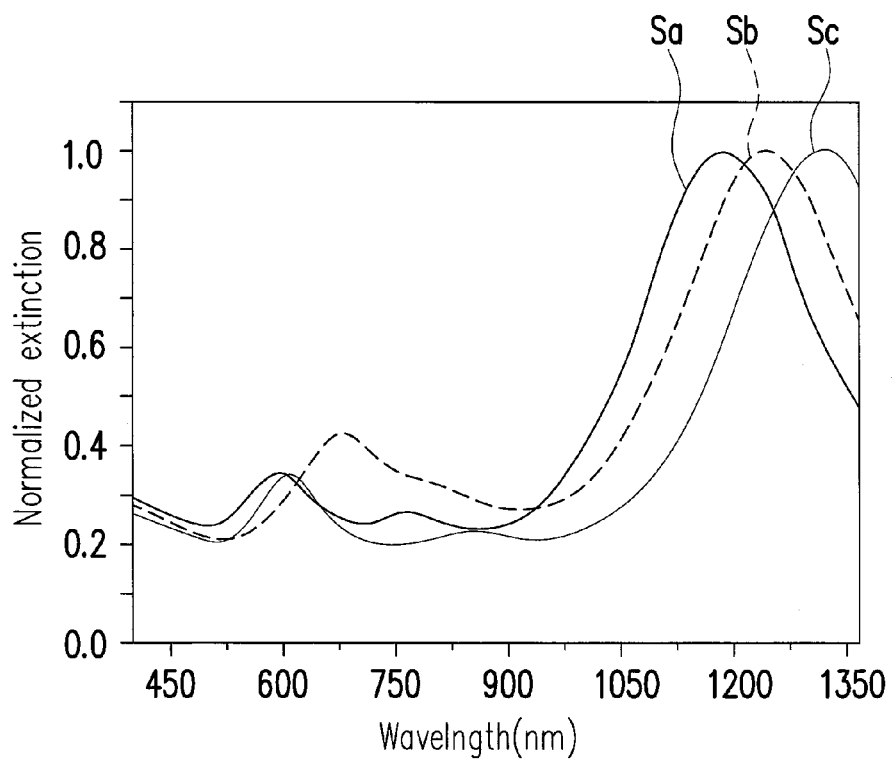
FIG. 2 shows the curves of the extinction spectra for the nanoparticles having various heights.

FIG. 2 shows the curves of the extinction spectrum for the nanoparticles having various heights. Referring to FIG. 2, three curves Sa, Sb and Sc represent the normalized extinction cross sections as functions of wavelength for three nanoring samples (with the same inner diameter of 140 nm) on the substrate with heights of 120 nm, 90 mm and 55 nm respectively. In the extinction spectrum, the major peaks of the three curves Sa, Sb and Sc present around the wavelengths of 1050 nm~1350 nm correspond to the cross-ring dipole resonance mode of localized surface plasmon. The wavelength corresponding to the extinction maximum of LSPR, which is considered as the major spectral feature, is so called the LSPR wavelength. From FIG. 2, the LSPR wavelength increases as the height of the nanoring decreases. That means the LSPR wavelength (the cross-ring dipole LSPR spectral feature) is red-shifted.

Therefore, nanoparticles or nanorings of longer LSPR wavelengths, which are suitable for biomedical applications, can be obtained by reducing the height of the nanoparticles or nanorings. For the nanorings as described above, the height of the nanorings can be decreased by reducing the height of the pillar structures (nanopillars).

Figure 3:
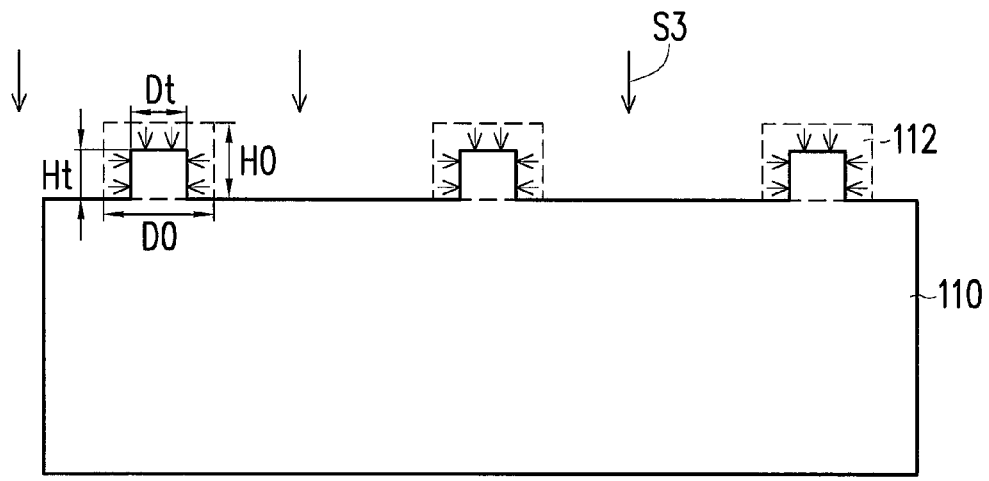
FIG. 3 is a schematic diagram showing the height and diameter of the tuned pillar structure according to one embodiment of the present invention.

Fine-tuning the height and/or size of already-formed pillar structures may be beneficial for acquiring the desirable height and/or sizes of the nanorings or nanoparticle. One possible approach for fine-tuning the height of the pillar structures (nanopillars) is to perform a reactive ion etching process or irradiate ozone with UV light to generate free radicals for etching, before the formation of the metal material layer and the formation of the ring structures. FIG. 3 is a schematic diagram showing the height and diameter of the tuned pillar structure according to one embodiment of the present invention. In this embodiment, the original height H0 and diameter D0 of each pillar structure 112 are fine-tuned into a reduced height Ht and reduced diameter Dt by performing oxygen ($O_2$) plasma reactive ion etching process S3, for example. In other embodiments, the gas used in the reactive ion etching process may be tetrafluorocarbon or sulfur hexafluoride, for example. By using the reactive ion etching process S3 of high anisotropic reactivity and high etching selectivity, the sizes of the tuned nanorings are well controlled and highly uniform.

Such fine-tuning process may be advantageous to the accurate control of the LSPR wavelengths of the nanoparticles.

Furthermore, a surface modification process may be performed to the ring structures R before separating the ring structures R from the pillar structures or the substrate. The surface modification process may be bio-conjugation for targeted photothermal therapy or targeted imaging, fluorescence emission for cellular imaging, surface modification for drug delivery or ferromagnetic coating for magnetic manipulation.

Figure 4:
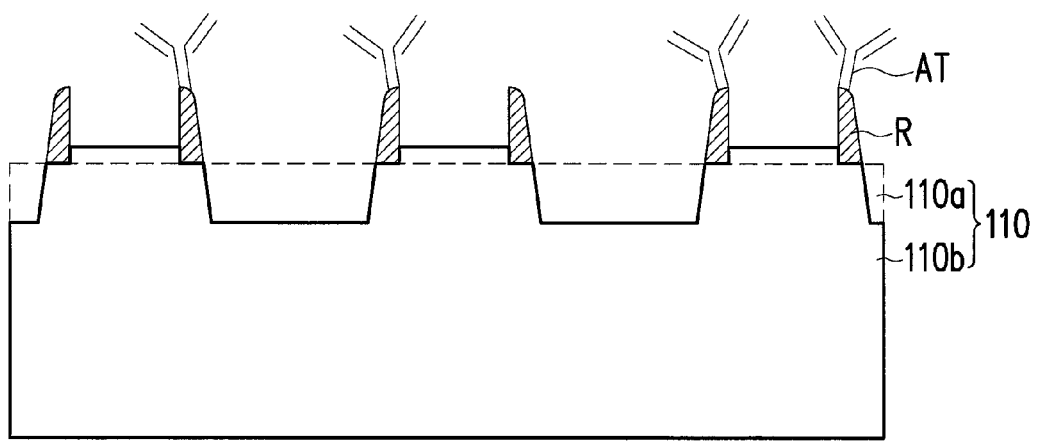
FIG. 4 is a schematic cross-sectional view showing the antibodies adhered to the ring structure.

FIG. 4 is a schematic cross-sectional view showing the antibodies adhered to the ring structure. Referring to FIG. 4, taking the bio-conjugation process as an example, the surface modification process will conjugate the ring structures R with a plurality of antibodies AT. In details, the substrate 110 and the ring structures R are immersed in a biolinker solution to modify the surfaces of the ring structures R. The biolinker may be 16-mercapto-1-hexadecanoic acid or 12-mercaptododecanoic acid, for example. In this embodiment, the immersion time is 20 hours, for example. To remove the residual biolinkers, the substrate 110 is rinsed with water.

Later, the substrate 110 is immersed in a mixed solution of 1-ethyl-3-[3-dimethylaminopropyl] carbodiimide hydrochloride (EDC), N-hydroxysulfosuccinimide (sulfo-NHS) and phosphate buffer saline (PBS) solution for 30 minutes, for example. Then, the antibody solution is added to the mixed solution for interaction for 24 hours. To remove the residual antibodies, the substrate 110 is rinsed with water. So far, the bio-conjugation process is completed.

Figure 5:
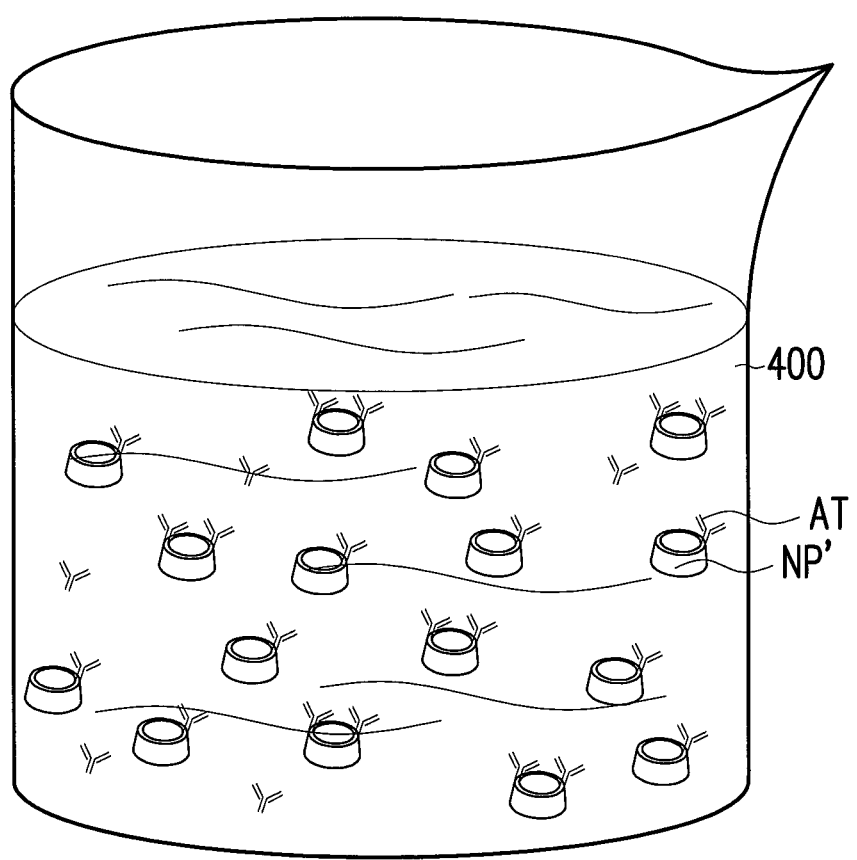
FIG. 5 is a schematic diagram showing the surface-modified nanoparticles according to one embodiment of the present invention.

As shown in FIG. 5, following the sonication step of FIG. 1E, the surface-modified (bio-conjugated) ring structures on the substrate are transferred into a solution 400 and surface-modified nanorings NP' are obtained. Additionally, a dispersant, such as α-methoxy-ω-mercapto-polyethylene glycol (mPEG-SH), may be added to avoid the aggregation of the surface-modified nanoparticles NP'.

The surface-modified nanoparticles NP' may be applicable for targeted photothermal therapy. The antibody(ies) AT conjugated with the surface-modified nanoparticles NP' are bound with the antigens of the cancer cells. Through the light source having a wavelength close to the LSPR wavelength of surface-modified nanoparticles NP', the illuminating light is greatly absorbed (LSPR-enhanced absorption) owing to the surface electron resonance of the nanoparticles NP' and heat is then generated to put the cancer cells around to death.

In the conventional surface modification process, the nanoparticles are surface-modified in the solution. Therefore, repeated sonication processes are required to avoid aggregation of the nanoparticles and several times of centrifugal operations are needed to remove the residual chemicals, which will result in tremendous loss of nanoparticles and low yields of the surface-modified nanoparticles. On the other hand, the surface-modified nanoparticles NP' as described herein are obtained by the surface treatment of the ring structures R adhered to the pillar structures 112b or the substrate 110b, so that simply rinsing steps are performed to remove the residual chemicals and no additional sonication steps are needed for preventing aggregation of surface-modified nanoparticles NP'. Therefore, the loss of nanoparticles is lowered and the yield of the surface-modified nanoparticles is increased.

The present invention provides nanoparticles of a uniform size by using nano-imprinting technology. Additionally, fine-tuning the sizes (including the height and the diameter) of the nanoparticles can be beneficial for controlling the inner diameters and heights of the nanoparticles. The height, the diameter and the combination thereof may be well controlled to provide nanoparticles of longer LSPR wavelengths for biomedical applications.

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not be necessarily being drawn to scale. There may be distinctions between the artistic renditions in the present disclosure and the actual apparatus due to manufacturing processes and tolerances. There may be other embodiments of the present invention which are not specifically illustrated. The specification and the drawings are to be regarded as illustrative rather than restrictive. Modifications may be made to adapt a particular situation, material, composition of matter, method, or process to the objective, spirit and scope of the invention. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the invention.

What is claimed is:

1. A method for fabricating nanoparticles, the method comprising:
   providing a substrate having a plurality of pillar structures thereon;
   forming a plurality of ring structures respectively surrounding the plurality of the pillar structures, an inner sidewall of each ring structure surrounds a sidewall of each pillar structure;
   removing a portion of each pillar structure and to expose a portion of the inner wall of each ring structure; and
   separating the plurality of the ring structures from the remained pillar structures to form a plurality of nanoparticles.

2. The method of claim 1, wherein providing a substrate having a plurality of pillar structures thereon comprises performing a nano-imprinting process to the substrate to form the plurality of the pillar structures.

3. The method of claim 1, wherein a material of the plurality of the ring structures is a metal.

4. The method of claim 1, further comprising fine-tuning a height, a diameter or a combination thereof each pillar structure before forming the plurality of the ring structures.

5. The method of claim 4, wherein fine-tuning a height, a diameter or a combination thereof each pillar structure comprising performing a reactive ion etching process or irradiating ozone with UV light to generate radicals for etching.

6. The method of claim 5, wherein the reactive ion etching process includes using oxygen, tetrafluorocarbon or sulfur hexafluoride as a gas.

7. The method of claim 1, wherein forming the plurality of the ring structures comprises:
   forming a metal material layer covering the substrate and a top surface of each pillar structure; and
   performing an ion bombardment process to sputter a metal material of the metal material layer to be adhered onto the sidewall of each pillar structure, so as to form the ring structure.

8. The method of claim 7, wherein the metal material layer on the top surface of each pillar structure is removed during the ion bombardment process.

9. The method of claim 7, wherein the ion bombardment process includes a reactive ion etching process or an ion milling process.

10. The method of claim 9, wherein the reactive ion etching process includes using trifluoromethane, argon, oxygen, tetrafluorocarbon or sulfur hexafluoride as a gas.

11. The method of claim 1, wherein removing a portion of each pillar structure comprising performing a reactive ion etching process or irradiating ozone with UV light to generate radicals for etching.

12. The method of claim 11, wherein the reactive ion etching process includes using oxygen, tetrafluorocarbon or sulfur hexafluoride as a gas.

13. The method of claim 1, wherein separating the plurality of the ring structures from the remained pillar structures comprises performing a sonication step.

14. The method of claim 1, further comprising performing a surface modification process to the plurality of the ring structures before separating the plurality of the ring structures from the remained pillar structures.

15. The method of claim 14, wherein the surface modification process includes conjugating the plurality of the ring structures with a plurality of antibodies.

* * * * *